United States Patent
Westra et al.

(10) Patent No.: US 10,903,641 B2
(45) Date of Patent: Jan. 26, 2021

(54) FAST OVERVOLTAGE PROTECTION CIRCUIT WITH DIGITAL CONTROL

(71) Applicant: Avago Technologies General IP (Singapore) Pte. Ltd., Singapore (SG)

(72) Inventors: Jan Roelof Westra, Uithoorn (NL); Jan Mulder, Bunnik (NL)

(73) Assignee: AVAGO TECHNOLOGIES INTERNATIONAL SALES PTE. LIMITED, Singapore (SG)

(*) Notice: Subject to any disclaimer, the term of this patent is extended or adjusted under 35 U.S.C. 154(b) by 358 days.

(21) Appl. No.: 15/955,632

(22) Filed: Apr. 17, 2018

(65) Prior Publication Data
US 2019/0319444 A1 Oct. 17, 2019

(51) Int. Cl.
| | | |
|---|---|---|
| H02H 1/04 | (2006.01) | |
| H02H 1/00 | (2006.01) | |
| H02H 7/20 | (2006.01) | |
| H03M 1/66 | (2006.01) | |
| H04B 1/04 | (2006.01) | |
| H02H 9/04 | (2006.01) | |
| H04B 1/16 | (2006.01) | |

(52) U.S. Cl.
CPC ............ *H02H 1/0061* (2013.01); *H02H 7/20* (2013.01); *H02H 9/04* (2013.01); *H03M 1/66* (2013.01); *H04B 1/04* (2013.01); *H04B 1/16* (2013.01)

(58) Field of Classification Search
CPC ............ H02H 9/05; H02H 9/008; H02H 9/02; H02H 9/025; H02H 9/04; H02H 9/046; H02H 1/0007; H01L 27/0251; H01L 27/0266; H01L 27/0248
See application file for complete search history.

(56) References Cited

U.S. PATENT DOCUMENTS

| | | | |
|---|---|---|---|
| 10,547,212 B2* | 1/2020 | Uchimoto | ............. H04B 5/0037 |
| 2006/0179372 A1* | 8/2006 | Volk | .................... G06F 13/4072 |
| | | | 714/724 |
| 2014/0063666 A1* | 3/2014 | Kallal | .................... H02J 7/0029 |
| | | | 361/56 |
| 2017/0294798 A1* | 10/2017 | Yuk | ..................... H02J 7/00034 |
| 2019/0235041 A1* | 8/2019 | Lee | ......................... H02J 50/40 |

* cited by examiner

*Primary Examiner* — Adolf D Berhane
(74) *Attorney, Agent, or Firm* — Morgan, Lewis & Bockius LLP

(57) ABSTRACT

A wired communication apparatus includes a receiver, a transmitter and a control circuit. The receiver includes a signal detection circuit. The transmitter includes a number of digital-to-analog converter (DAC) cells. The control circuit can receive an overvoltage signal from the receiver and can disable an output of the transmitter based on the overvoltage signal. The signal detection circuit is operable in a special mode to detect an overvoltage event at an input port of the receiver, and the control circuit can disable the output of the transmitter for a programmable time period.

20 Claims, 7 Drawing Sheets

US 10,903,641 B2

FAST OVERVOLTAGE PROTECTION CIRCUIT WITH DIGITAL CONTROL

TECHNICAL FIELD

The present description relates generally to integrated circuits, and more particularly, to fast overvoltage protection circuit with digital control.

BACKGROUND

New semiconductor integrated circuit (IC) technologies are quite sensitive to overvoltage over active devices. In particular, in new Fin field-effect transistor (FinFET) technologies (e.g., with 16 nm, 10 nm and 7 nm feature sizes) devices are less tolerant to overvoltage events. Therefore, circuits implemented in these technologies need fast overvoltage detection and protection circuits. For example, in wired communication systems, such as Ethernet, handshaking link pulses can, in certain circumstances, cause overvoltage at the transceiver output.

For instance, an Ethernet transmitter (TX) may send signals to a far-end receiver (RX), while at the same time the receiver (RX) may receive signals from the far-end transmitter (TX). In order to build up such a full-duplex link, special high-amplitude link pulses can be sent over a connecting medium (e.g., a cable) such that a far-end receiver can recognize these link pulses and start building the link. At the moment that the link pulses are sent, it is unknown to the transmitting end whether a cable and/or a far-end receiver are present. When no far-end receiver is present, the line impedance is doubled, causing a double-amplitude voltage on the output of the transceiver of the transmitting end, which can possibly damage the internal transistors due to overvoltage.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, systems and configurations are described for providing fast overvoltage protection with digital control. The overvoltage protection of the subject technology enables fast detection of overvoltage situations as well as fast protection against these overvoltage situations. The implementation of the disclosed overvoltage detection and protection technology does not limit analog bandwidth, is digitally programmable, and can be efficiently ported to new technologies.

Figure 1:
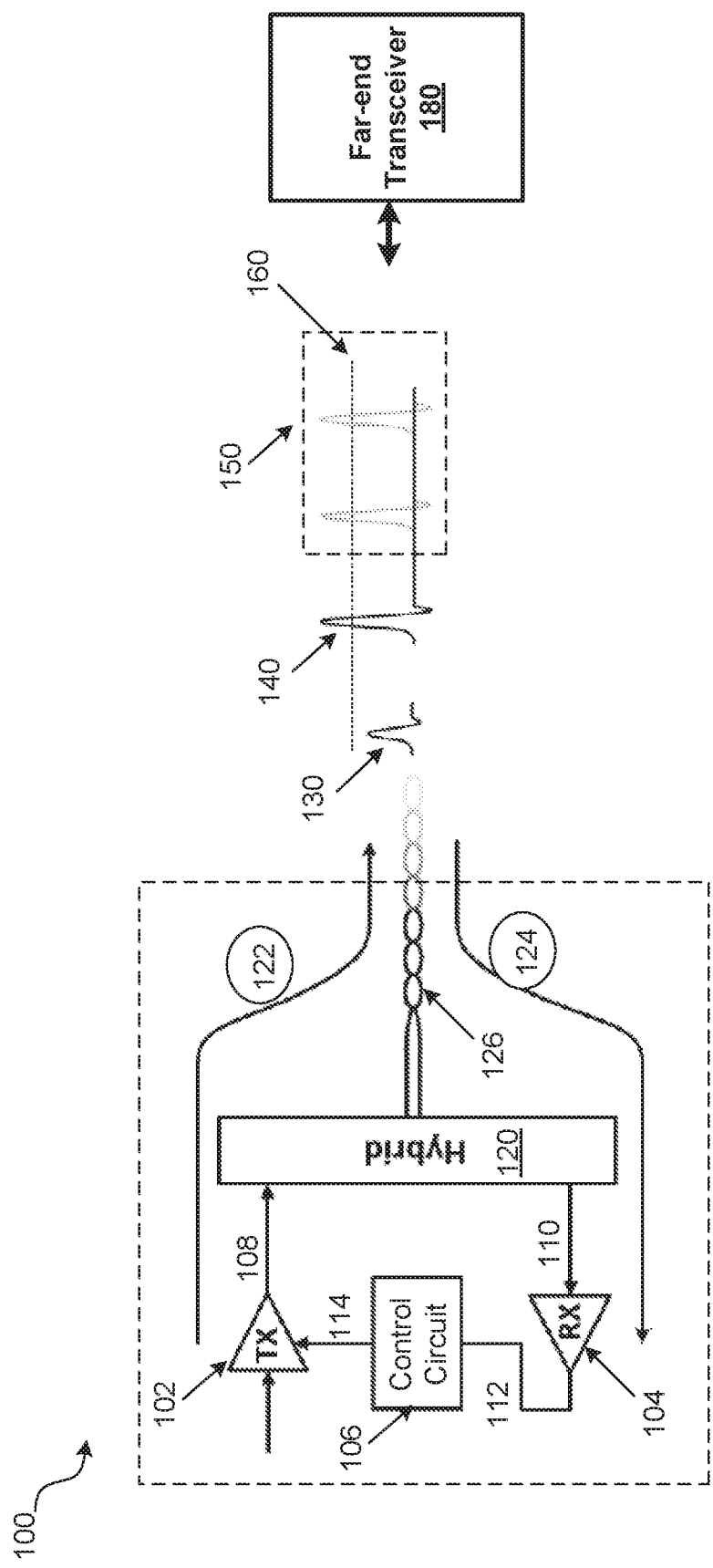
FIG. 1 is a high-level block diagram illustrating an example of an apparatus with fast overvoltage protection via digital control, according to aspects of the subject technology.

FIG. 1 is a high-level block diagram illustrating an example of an apparatus 100 with fast overvoltage protection via digital control, according to aspects of the subject technology. The apparatus 100 is a wired communication (e.g., Ethernet) transceiver and includes a transmitter (TX) 102, a receiver (RX) 104, a control circuit 106 (controller) and a hybrid circuit 120. The hybrid circuit 120 is coupled to a cable 126 (e.g., twisted pair wires), which connects the apparatus 100 with a similar wired communication transceiver at a far-end represented by a far-end transceiver 180 (also referred to as a "far-end device"). The hybrid circuit 120 is responsible for preventing the signals transmitted by the TX 102 from reaching the RX 104, for example, by attenuation or cancelation of the transmitted signals in their path to the RX 104.

The apparatus 100 can communicate with the far-end transceiver 180 through a full duplex communication link. For example, the TX 102 can send signals 122 to the far-end transceiver 180, and at the same time, the RX 104 can receive signals 124 from the far-end transceiver 180. In order to establish the full-duplex link, one or more special high-amplitude link pulses are sent onto the cable 126 such that a receiver of the far-end transceiver 180 can recognize the link pulses (e.g., 130) and start building the full duplex link. An example range of values for amplitude of the link pulses 130 is about 1-1.5 V at the transmitter side. In some implementations, at the receiver side, detection levels of about 200-400 mV can be used. At the moment the link pulses are sent, it is unknown whether a cable and/or the far-end transceiver are present (e.g., connected and/or active). When no far-end receiver is present, the line impedance is doubled (e.g., 100Ω), causing a double amplitude pulse 140 on an output port of the TX 102 and/or RX 104, possibly damaging the internal transistors by overvoltage. The receiver 104 can detect the double amplitude pulse 140 that exceed a threshold 160, and upon such a detection, can send an overvoltage pulse 112 to the control circuit 106. An example range of values for an amplitude of the double amplitude pulse 140 is about 2-3 V. This range of values can approximately double when the cable is removed. The control circuit 106, in response, sends a control signal 114 to the TX 102 and cancels transmission of further link pulses 150.

The existing solution analyzes the output of the receiver by a microcontroller running firmware. The microcontroller is responsible for controlling the output amplitude of the transmitter. One shortcoming of the existing solution is that the microcontroller may also be busy performing other tasks, which makes the detection too slow. Further, the amplitude control is too slow for overvoltage mitigation of the transistors in modern integrated circuits (ICs) manufactured using, for example, with Fin field-effect transistor (FinFET) technologies. FinFET devices of at low feature sizes (e.g., 16 nm, 10 nm and 7 nm) are less tolerant to overvoltage events and cannot be protected by the existing slow solution.

In the fast overvoltage protection of the subject technology, the overvoltage is digitally controlled with the control circuit 106, which is a dedicated fast digital control circuit, as described herein, and can reliably protect the less overvoltage tolerant transistors of the modern ICs.

Figure 2:
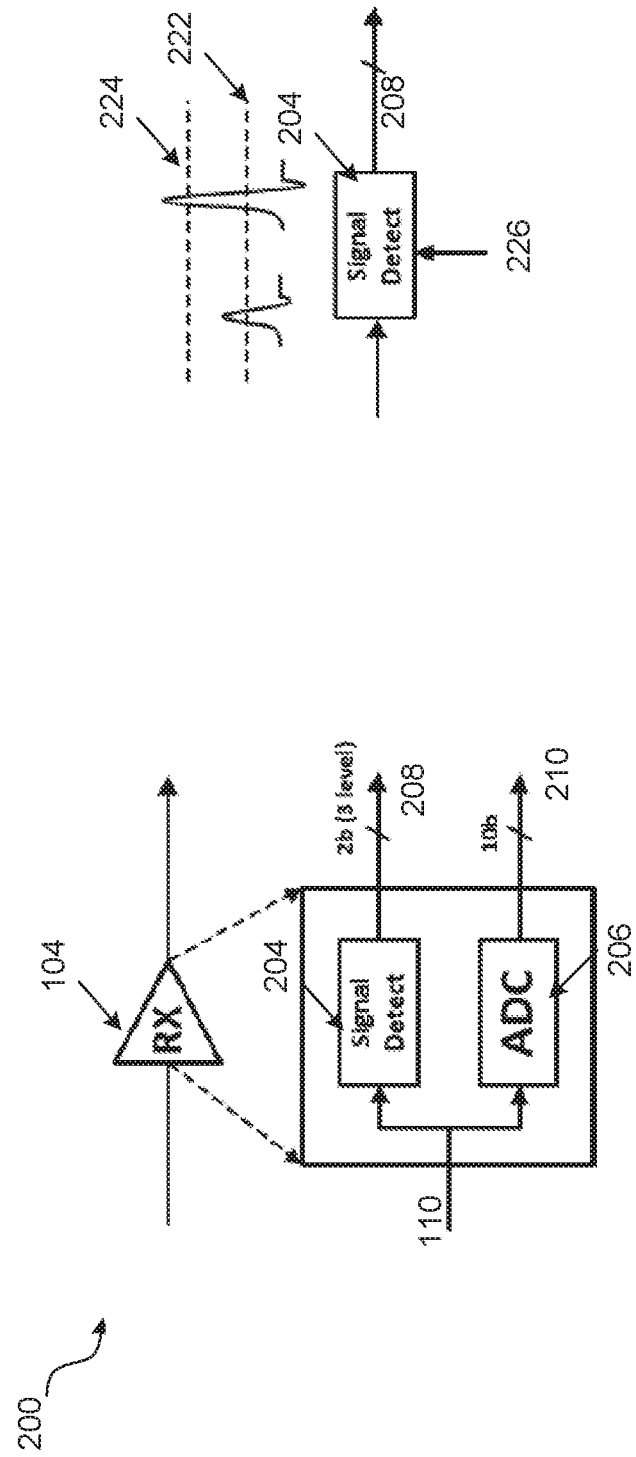
FIG. 2 is a block diagram illustrating an example receiver circuit of the apparatus of FIG. 1, according to aspects of the subject technology.

FIG. 2 is a block diagram illustrating an example receiver circuit 104 of the apparatus 100 of FIG. 1, according to aspects of the subject technology. In an example Ethernet implementation, the receiver circuit 104 includes a signal detection circuit 204 and an analog-to-digital converter (ADC) 206. In some implementations, the signal detection circuit 204 can be a three-level (e.g., 2-bit) signal detect circuit that receives the link pulses, for example, from the far-end transceiver 180 of FIG. 1. The ADC 206 is responsible for converting the actual received signal (e.g., other than link pulses) received from the far-end transceiver 180 from analog to digital form. The ADC 206 can be powered down when the link with far-end transceiver 180 (e.g., through the cable 126 of FIG. 1) is not active, for instance, when the cable 126 is disconnected from the apparatus 100 of the far-end transceiver 180 or the far-end transceiver 180 is in an off state.

In some implementations, the signal detection circuit 204, can be programmable and be programmed, for example, by programmable threshold level signal 226 provided by a processor. The threshold level signal 226 can control threshold levels 222 and 224 respectively associated with a receive-mode and a link-pulse transmit mode of the signal detection circuit 204. When the signal detection circuit 204 detects a transmitted link-pulse with an amplitude higher than the threshold level 224, the signal detection circuit 204 can provide an overvoltage signal 208. The transmitted link-pulse with the amplitude exceeding the threshold level 224 can be from the TX 102, when the link with far-end transceiver 180 (e.g., through the cable 126 of FIG. 1) is not active. In some implementations, the overvoltage signal 208 can be a three-level (e.g., 2-bit) signal. The overvoltage signal 208 is sent to the control circuit 106 of FIG. 1 and is used to cancel link pulse transmission of the TX 102 when no far-end transceiver 180 is present or the cable 126 is disconnected. The threshold level 222 is for the normal link pulses received from the far-end transceiver 180.

Figure 3:
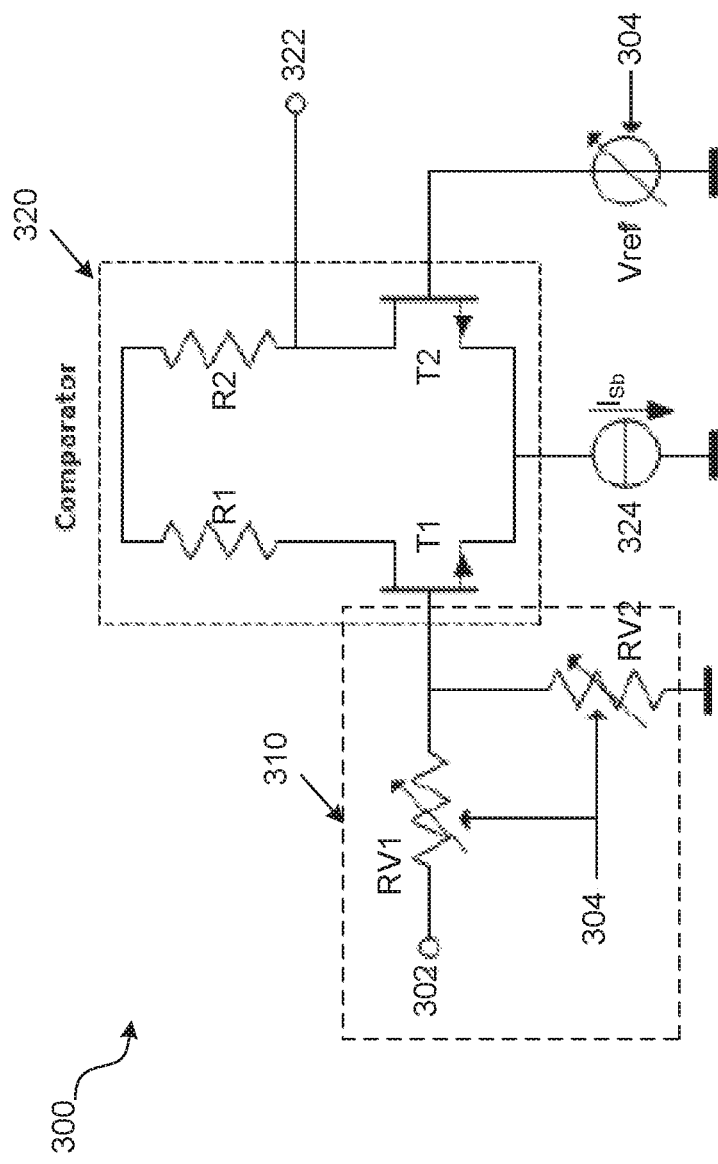
FIG. 3 is a schematic diagram illustrating an example implementation of a signal detection circuit of the receiver of FIG. 2, according to aspects of the subject technology.

FIG. 3 is a schematic diagram illustrating an example implementation of a signal detection circuit 300 of the receiver of FIG. 2, according to aspects of the subject technology. The signal detection circuit 300 is an example circuit implementation of the signal detection circuit 204 of FIG. 2. The signal detection circuit 300 includes a comparator 320, an attenuator 310, a bias current source 324 and a reference voltage Vref. The comparator 320 includes a pair of transistors (e.g., FET) T1 and T2 and drain resistors R1 and R2. A bias current $I_{Sb}$ is provided by the bias current source 324, which is coupled between the common source node of the transistors T1 and T2 and the ground potential. The reference voltage Vref is coupled to a gate node of transistor T2 and the attenuator 310 is coupled to a gate node of the transistor T1. The comparator 320 compares the voltages at the gate nodes of the transistor T1 and T2 and provides an output 322 based on the comparison result.

The attenuator 310 includes variable resistors RV1 and RV2. The attenuation of the attenuator 310 is controlled by a transmit-mode control signal 304 (e.g., control signal 114 of FIG. 1) provided by the control circuit 106 of FIG. 1. The attenuator 310 can attenuate an input signal 302 and can provide a controllable fraction of the input signal 302 to the first input (e.g., gate node of transistor T1) of the comparator 320, which is compared to the reference voltage Vref. The reference voltage Vref is a variable reference voltage and can be controlled by the transmit-mode control signal 304. In some implementations, the transmit-mode control signal 304 can control the attenuation of the attenuator 310 and/or the amplitude of the reference voltage Vref, to control the threshold levels 222 and 224 of FIG. 2.

Figure 4:
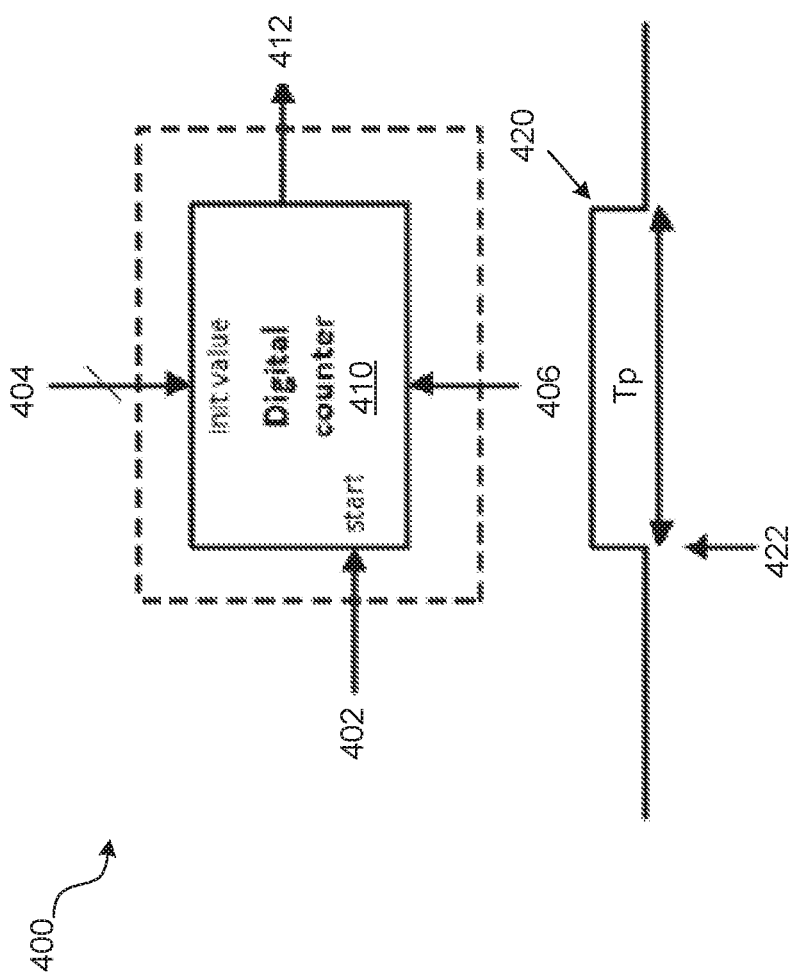
FIG. 4 is a block diagram illustrating an example implementation of the control circuit of the apparatus of FIG. 1, according to aspects of the subject technology.

FIG. 4 is a block diagram illustrating an example implementation of the control circuit 400 of the apparatus 100 of FIG. 1, according to aspects of the subject technology. The control circuit 400 is an implementation of the control circuit 106 of FIG. 1. The control circuit 400 includes a digital control circuit formed by a digital counter 410. The control circuit 400 can be started by receiving at start input of the digital counter 410 a detector output signal 402 (e.g., 322 of FIG. 3) from the signal detection circuit 300 of FIG. 3. The control circuit 400 also receives a clock signal 406 and a preload value 404 and provides an output 412. The digital counter 410 can be preloaded with the preload value 404 at an initial (init) value input of the counter. The counter output is a time slot 420, the duration Tp of which is determined by the preload value 404 and a period of the clock signal 406. The output 412 represents an example of the control signal 114 of FIG. 1 that is used to suppress the transmitter output (e.g., of TX 102 of FIG. 1).

Figure 5A:
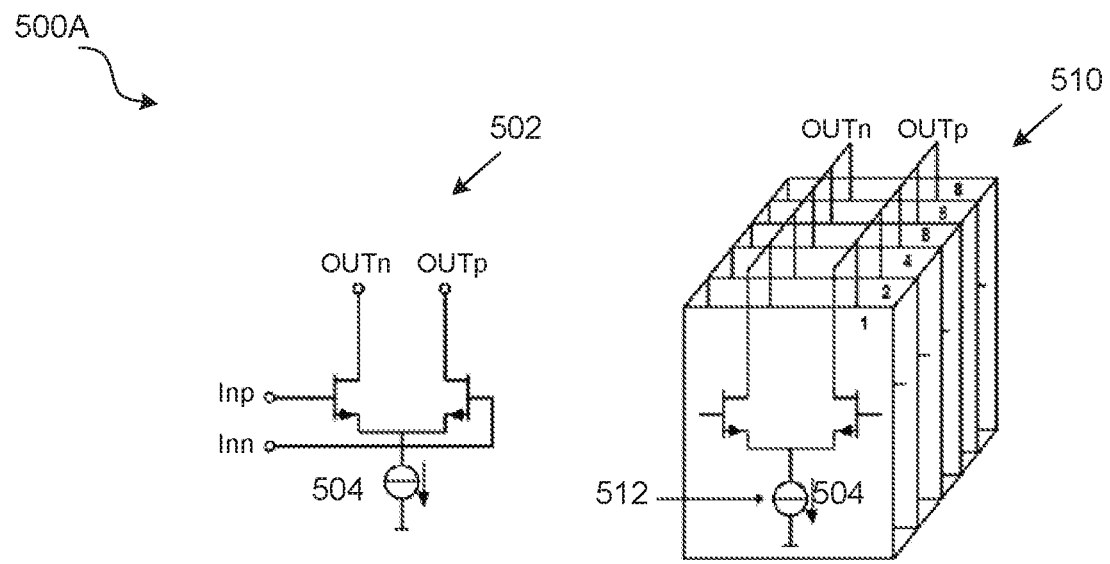
FIGS. 5A-5B are schematic diagrams illustrating example implementations of a transmitter of the apparatus of FIG. 1, according to aspects of the subject technology
Figure 5B:
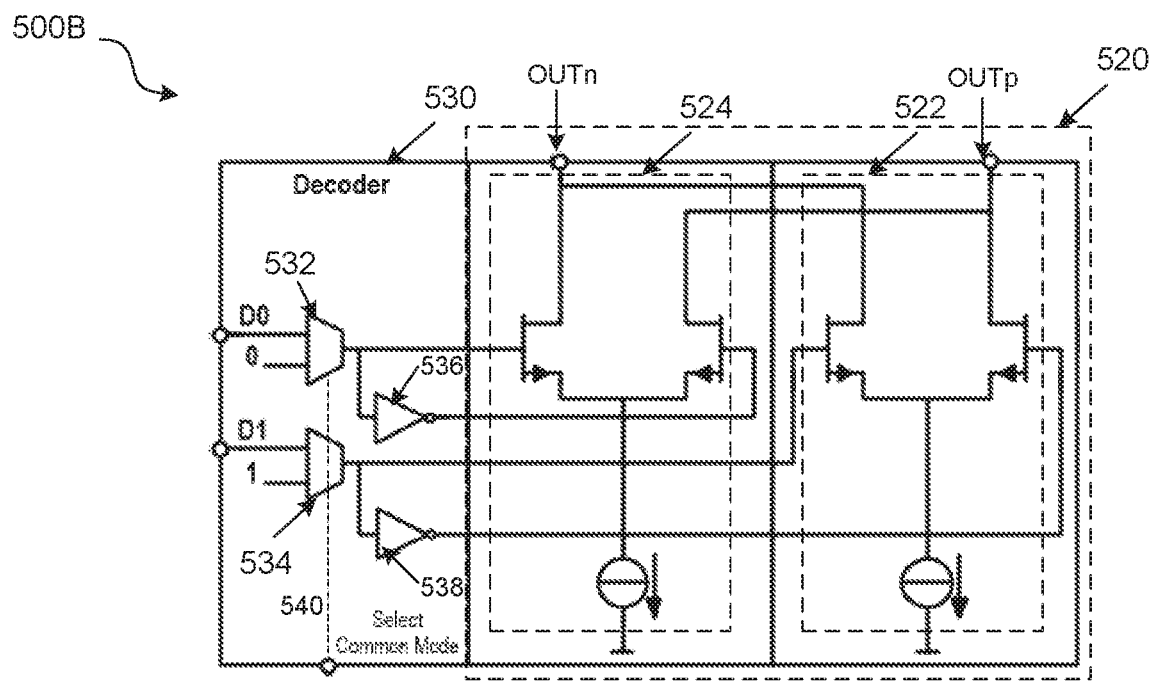

FIGS. 5A-5B are schematic diagrams illustrating example implementations 500A and 500B of a transmitter of the apparatus of FIG. 1, according to aspects of the subject technology. In the example implementation 500A, the transmitter (e.g., TX 102 of FIG. 1) is realized by a digital-to-analog (DAC) 510 formed of scaled versions of a number of DAC cells 502, each coupled to a bias current source 504. The bias current source 504 is controlled by an on/off signal 512 (e.g., 412 of FIG. 4) received from the digital control circuit 400 of FIG. 4. In the DAC cell 502, two complementary digital inputs (Inp and Inn) can switch a current provided by the bias current source 504 between analog outputs (Outp, Outn) to generate an analog output signal. The analog output signal is a differential signal derived from outputs Outp and Outn. In some implementations, the DAC 510 includes many (e.g., 64 or more) large unary cells (denoted by 8) combined with a few (e.g., 3) binary scaled cells (denoted by 1, 2 and 4). The on/off signal 512 can directly switch off all or some of the bias current sources 504 of the DAC cells, for example, the unary DAC cells. It is understood that switching off all currents may generate a large common-mode output signal, which can be undesired in the transmission system. The example implementation 500B shown in FIG. 5B, mitigates this problem, as described below.

As shown in the example implementation 500B, two equally weighted DAC cells 522 and 524 of the unary DAC cells can be combined in pairs to form a DAC 520, which is coupled to a decoder 530. The decoder 530 includes selectors 532 and 534 and inverters 536 and 538. The pairs can be switched by a selection signal 540 between a first mode in which data (D0/D1) is converted and a second mode in which the cells are put in common mode. In the common mode, the differential output (e.g., between Outp and Outn) is zero, but the common mode current stays active such that no common mode transition is observed at the output of the D/A converter.

Figure 6:
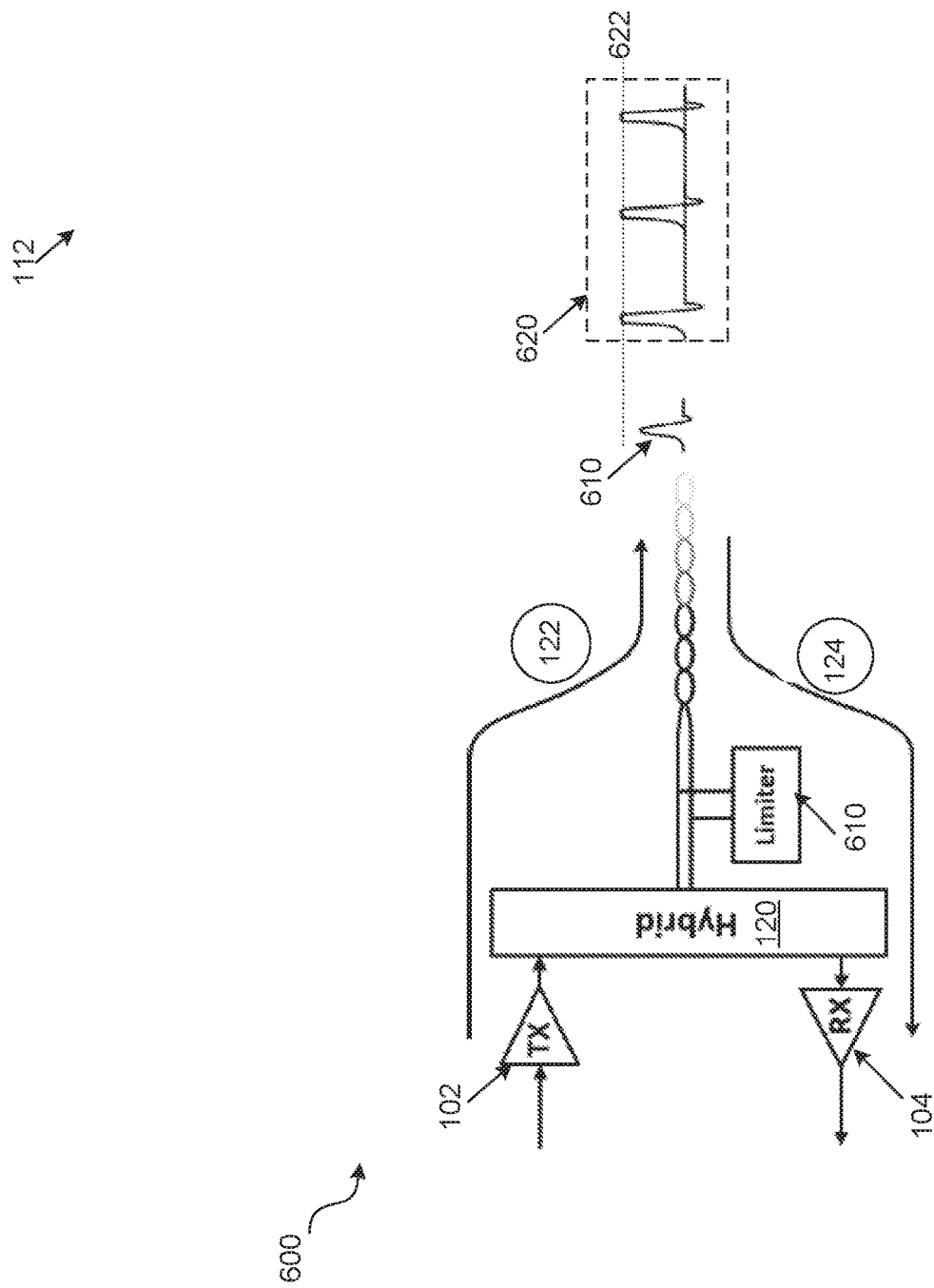
FIG. 6 is a conceptual diagram illustrating an example of an apparatus with overvoltage protection, according to aspects of the subject technology.

FIG. 6 is conceptual a diagram illustrating an example of an apparatus 600 with overvoltage protection, according to aspects of the subject technology. The apparatus 600 is similar to the apparatus 100 of FIG. 1, except that the control circuit 106 of FIG. 1 is omitted and a limiter 610 is added between output nodes of the hybrid circuit 120. The limiter 610 is an analog limiter that may simply be realized by a diode. While the normal link pulses can readily pass the limiter 610 with no change, over voltage-causing link pulses 620 are clipped at an amplitude level 622. It is understood that the limiter 610 may possibly cause analog distortion at the transceiver output and may limit the analog bandwidth at the transceiver output. Further, the limiter 610 may be less accurate and may be less easy to port to newer technologies.

Figure 7:
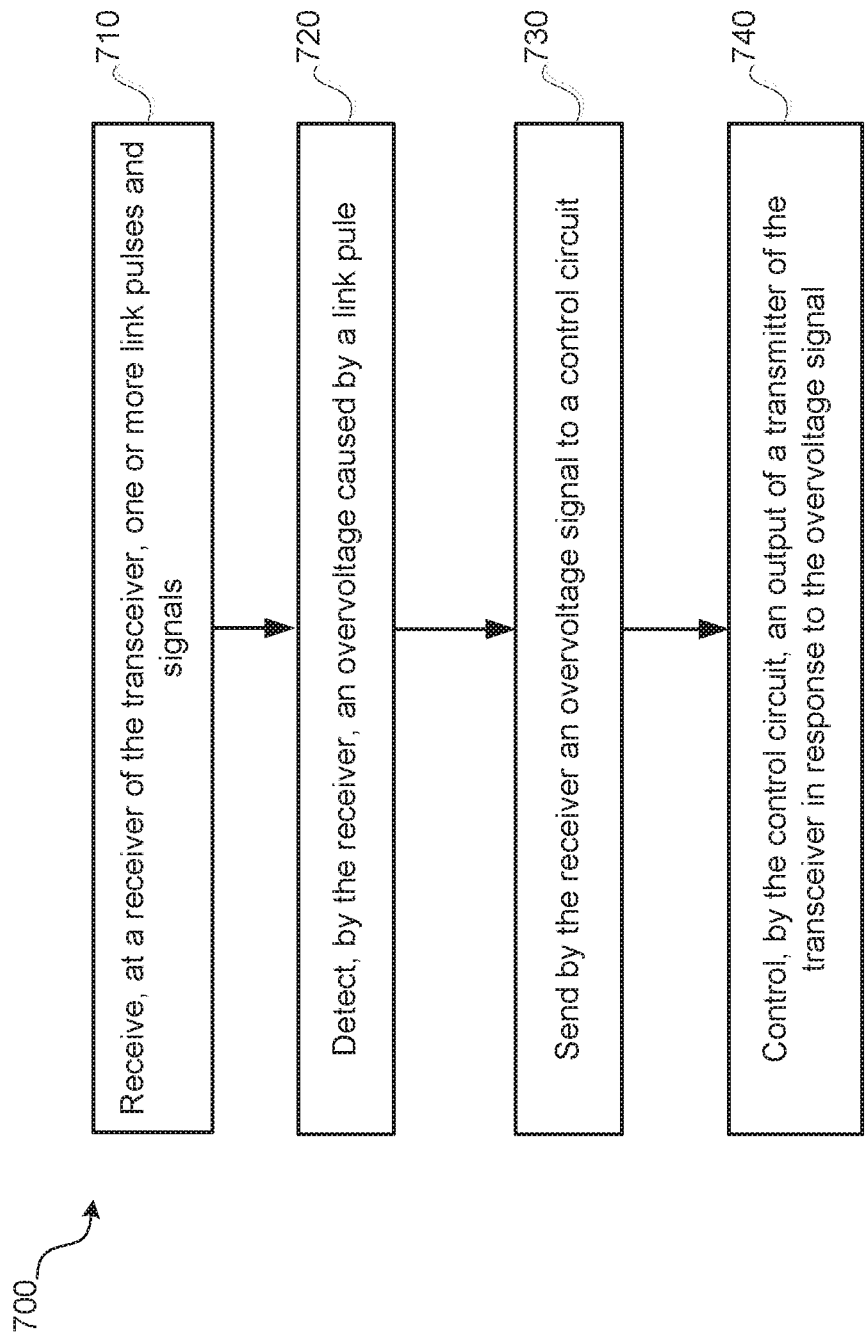
FIG. 7 is a flow diagram illustrating an example method of fast overvoltage protection via digital control, according to aspects of the subject technology.

FIG. 7 is a flow diagram illustrating an example method 700 of fast overvoltage protection via digital control, according to aspects of the subject technology. The method 700 receiving, at a receiver (e.g., 104 of FIG. 1) of the transceiver (e.g., 100 of FIG. 1), one or more link pulses (e.g., 130 and 140 of FIG. 1) and signals (710). The method further includes detecting, by the receiver (e.g., 104 of FIG. 1), an overvoltage caused by a link pule (e.g., 140 pf FIG. 1) (720). The receiver sends an overvoltage signal (e.g., 112 of FIG. 1) to a control circuit (e.g., 106 of FIG. 1) (730). The control circuit controls an output of a transmitter (e.g., 102 of FIG. 1) of the transceiver in response to the overvoltage signal (740). Controlling the output of the transmitter is by disabling the output of the transmitter for a programmable time period (e.g., Tp of FIG. 4). The link pulse is receivable from the transmitter when a link between the transceiver and a far-end transceiver is not active.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus comprising:
   a receiver including a signal detection circuit;
   a transmitter; and
   a control circuit configured to receive an overvoltage signal from the receiver and to disable an output of the transmitter based on the overvoltage signal,
   wherein:
   the signal detection circuit is operable in a special mode to detect an overvoltage event at an input port of the receiver, and
   the control circuit is configured to disable the output of the transmitter for a programmable time period.

2. The apparatus of claim 1, wherein the apparatus comprises an Ethernet transceiver operable to be linked through a transmission medium to a far-end transceiver, and wherein the transmitter includes a plurality of digital-to-analog converter (DAC) cells.

3. The apparatus of claim 2, wherein the overvoltage event is caused by reception of a link pule of the transmitter when the transmission medium or the far-end transceiver is not present.

4. The apparatus of claim 1, wherein the signal detection circuit is configured to generate the overvoltage signal based on a programmable threshold level.

5. The apparatus of claim 4, wherein the programmable threshold level is controlled by a processor, and wherein the overvoltage signal comprises a 3-level signal.

6. The apparatus of claim 5, wherein the signal detection circuit comprises a comparator circuit, and wherein the processor is configured to control the programmable threshold level by exerting control on a reference voltage or on an input attenuation circuit of the comparator circuit.

7. The apparatus of claim 1, wherein the receiver further comprises an analog-to-digital converter (ADC) configured to convert a signal received from a transmission medium linked to a far-end transceiver when a link between the apparatus and the far-end transceiver is active.

8. The apparatus of claim 1, wherein the control circuit comprises a digital control circuit, and wherein the digital control circuit comprises a digital counter configured to start counting in response to the overvoltage signal and continue counting for the programmable time period.

9. The apparatus of claim 1, wherein the transmitter includes a plurality of DAC cells, and wherein the plurality of DAC cells comprises a plurality of unary DAC cells combined with a number of binary DAC cells, and the control circuit is configured to disable the transmitter by switching off current sources of the plurality of unary DAC cells.

10. The apparatus of claim 1, wherein the transmitter includes a plurality of DAC cells, and wherein the plurality of DAC cells comprise a plurality of unary DAC cells combined with a number of binary DAC cells, and wherein equally weighted DACs of the plurality of unary DAC cells are combined in pairs.

11. The apparatus of claim 10, wherein the control circuit is configured to disable the transmitter by enabling operation of combined pairs of unary DAC cells in a common mode of operation.

12. The apparatus of claim 11, wherein input nodes of the combined pairs of unary DAC cells are coupled to a decoder circuit configured to selectively allow operation of the combined pairs of unary DAC cells in the common mode of operation or in a normal mode of operation, wherein in the common mode of operation, output voltages of the combined pairs of unary DAC cells are nearly zero, while current sources of the combined pairs of unary DAC cells are not switched to zero.

13. A method of overvoltage protection for a transceiver, the method comprising:
  receiving, at a receiver of the transceiver, one or more link pulses and signals;
  detecting, by the receiver, an overvoltage caused by a link pule;
  sending, by the receiver, an overvoltage signal to a control circuit; and
  controlling, by the control circuit, an output of a transmitter of the transceiver in response to the overvoltage signal,
  wherein:
    controlling the output of the transmitter comprises disabling the output of the transmitter for a programmable time period,
    the link pulse is receivable from the transmitter when a link between the transceiver and a far-end transceiver is not active.

14. The method of claim 13, further comprising generating, by the receiver, the overvoltage signal based on a programmable threshold level that is controllable by a processor.

15. The method of claim 14, wherein the receiver comprises a comparator circuit, and the method further comprises exerting control, by the processor, on a reference voltage or on an input attenuation circuit of the comparator circuit.

16. The method of claim 13, wherein the control circuit comprises a digital control circuit, and wherein the method further comprises starting counting of a counter of the digital control circuit in response to the overvoltage signal, and stopping the counting after a programmable time period to generate a control pulse for controlling the output of the transmitter.

17. The method of claim 13, wherein the transmitter comprises a plurality of unary DAC cells, wherein equally weighted DACs of the plurality of unary DAC cells are combined in pairs, and disabling the output of the transmitter comprises one of enabling operation of combined pairs of unary DAC cells in a common mode of operation or switching off current sources of the of plurality of unary DAC cells.

18. A wired communication device comprising:
  a transmitter configured to transmit signals and link pulses to a far-end device;
  a receiver including a signal detection circuit configured to detect an overvoltage event and generate an overvoltage signal in response to detection of the overvoltage event; and
  a control circuit configured to disable an output of the transmitter in response to receiving the overvoltage signal,
  wherein:
    the control circuit is configured to disable the output of the transmitter for a programmable time period, and
    the overvoltage event is caused by a link pulse of the transmitter when a link to the far-end device is not active.

19. The wired communication device of claim 18, wherein the signal detection circuit is configured to generate the overvoltage signal based on a programmable threshold level, wherein the signal detection circuit comprises a comparator circuit, and wherein a processor is configured to control the programmable threshold level by exerting control on a reference voltage or on an input attenuation circuit of the comparator circuit.

20. The wired communication device of claim 18, wherein the transmitter comprises a plurality of digital-to-analog converter (DAC) cells including unary DAC cells, wherein equally weighted DACs of the plurality of unary DAC cells are combined in pairs, and wherein the control circuit is configured to disable the transmitter by one of enabling operation of combined pairs of unary DAC cells in a common mode of operation or switching off current sources of the unary DAC cells.

* * * * *

UNITED STATES PATENT AND TRADEMARK OFFICE
CERTIFICATE OF CORRECTION

PATENT NO. : 10,903,641 B2
APPLICATION NO. : 15/955632
DATED : January 26, 2021
INVENTOR(S) : Jan Roelof Westra et al.

Page 1 of 1

It is certified that error appears in the above-identified patent and that said Letters Patent is hereby corrected as shown below:

In the Claims

Column 6, Line 47 Claim 3: "pule" should read --pulse--;

Column 8, Line 18 Claim 17: "of the of plurality" should read --of the plurality--.

Signed and Sealed this
Twenty-first Day of September, 2021

Drew Hirshfeld
*Performing the Functions and Duties of the*
*Under Secretary of Commerce for Intellectual Property and*
*Director of the United States Patent and Trademark Office*